United States Patent [19]

Weiss

[11] Patent Number: 5,594,240
[45] Date of Patent: Jan. 14, 1997

[54] STRAIN-OPTIC VOLTAGE MONITOR WHEREIN STRAIN CAUSES A CHANGE IN THE OPTICAL ABSORPTION OF A CRYSTALLINE MATERIAL

[75] Inventor: Jonathan D. Weiss, Albuquerque, N.M.

[73] Assignee: The United States of America as represented by the United States Department of Energy, Washington, D.C.

[21] Appl. No.: 407,148

[22] Filed: Mar. 20, 1995

[51] Int. Cl.$^6$ ...................................................... G01R 31/00
[52] U.S. Cl. ........................ 250/227.23; 324/72; 324/96; 324/457; 359/322
[58] Field of Search ...................... 250/227.23, 227.21, 250/231.1, 231.19; 324/244.1, 96, 97, 72, 72.5, 458, 457; 359/323, 322, 321, 315

[56] References Cited

U.S. PATENT DOCUMENTS

| 4,270,050 | 5/1981 | Brogardh | 250/231 |
| 4,356,448 | 10/1982 | Brogardh et al. | 250/227.23 |
| 4,493,995 | 1/1985 | Adolfsson et al. | 250/227.23 |
| 4,523,092 | 6/1985 | Nelson | 250/227.23 |
| 4,939,447 | 7/1990 | Bohnert et al. | 250/227.14 |
| 4,945,230 | 7/1990 | Saaski et al. | 250/227.23 |

OTHER PUBLICATIONS

J. D. Weiss et al., "Gallium Arsenide as an Optical Strain Gauge," Sand 94–0710J, Mar. 15, 1994.
J. D. Weiss, "Gallium Arsenide Strain-Optic Voltage Monitor," submitted to *Sensors, Journal of Applied Sensing Technology*, Dec. 1994, scheduled publication date: Sep., 1995.

*Primary Examiner*—Edward P. Westin
*Assistant Examiner*—John R. Lee
*Attorney, Agent, or Firm*—Russell D. Elliott; James H. Chafin; William R. Moser

[57] ABSTRACT

A voltage monitor which uses the shift in absorption edge of crystalline material to measure strain resulting from electric field-induced deformation of piezoelectric or electrostrictive material, providing a simple and accurate means for measuring voltage applied either by direct contact with the crystalline material or by subjecting the material to an electric field.

22 Claims, 6 Drawing Sheets

STRAIN-OPTIC VOLTAGE MONITOR WHEREIN STRAIN CAUSES A CHANGE IN THE OPTICAL ABSORPTION OF A CRYSTALLINE MATERIAL

GOVERNMENT RIGHTS

The United States Government has rights in this invention pursuant to Contract No. DE-ACO4-76DP00789 between the U.S. Department of Energy (DOE) and AT&T Technologies, Inc.

BACKGROUND OF THE INVENTION

1. Field of Invention

This invention pertains to monitoring voltage or electric field, and more particularly to precisely monitoring changes in the voltage by observing differences in light transmission through crystalline material which is stressed as a result of being affixed to material undergoing electrostrictive or piezoelectric structural change in response to electrical stimulation. Alternatively, the voltage changes may be monitored by observing differences in light transmission through certain crystalline material which, itself, exhibits piezoelectric or electrostrictive behavior.

2. Description of the Related Art

Voltage measurement is well known. Many typical forms of voltage analysis, including those employing common analog and digital methods, however, are not suited to certain technical applications because of problems associated with the wiring and electrical connectors that characterize those methods. Ordinary electrical wiring and components, for example, may generate (or be susceptible to) electromagnetic interference. Also, because of the possibility of creating sparks, standard electrical circuitry can pose hazards in potentially explosive environments.

Fiber-optic technology has been developed partly in response to the need for both energetic and sensing components that do not exhibit these shortcomings. Because of their unique structure, optical fibers are capable of highly accurate transmission of light, which is relatively unaffected by interference or other signal degrading phenomena. They are also generally safe in confined places where an explosion hazard exists.

Optical voltage meters are known and used. These employ various principles including the electro-optic (Pockels) effect and the alteration of light transmission through optical fibers by coating the fibers with an electrostrictive substance and then subjecting them to the effects of an electric field. Although these types of optical voltage meters are greatly superior to meters relying on ordinary electrical circuitry in many applications, they are not without certain limitations. Meters using optical fibers with electrostrictive coating, for example, often require that the fibers be very long in order to optimize the cumulative nature of the electrostrictive effect. The electro-optic effect has been demonstrated in the context of interferometry but may not be useful for some other purposes.

The present invention differs from the related art in that it utilizes the capacity of certain materials, used as substrates, to undergo a structural change in response to electrical stimuli. It also utilizes the strain dependence of optical absorption at the band edge of a semiconductor material which, in one type of application, is attached to the substrate. In the case of a piezoelectric ceramic substrate, used in one embodiment, electrical stimulation causes strain in it that is proportional to the applied field. This effects a characteristic change in the degree to which light passes through the attached semiconductor material at the band edge. For an electrostrictive ceramic substrate, used in a different embodiment of this invention, electrical stimulation creates a strain in the substrate that is quadratic, and a different characteristic change in light transmissibility of the attached semiconductor material occurs.

Changes in optical properties of crystalline materials have previously been used to detect and quantify physical strain. For example, Brogardh (U.S. Pat. No. 4,270,050, "Apparatus for Measuring Pressure Change By Absorption Spectrum Change") claimed an optical device for measuring physical forces by analyzing changes in optical transmission through a crystalline modulator subjected to those forces. Likewise, the inventor of the present invention independently described using the unique optical characteristics of gallium arsenide semiconductor material to measure physical forces ("Gallium Arsenide as an Optical Strain Gauge," J. D. Weiss, S. S. Lopez, and A. J. Howard, SAND 94-0710J, Sandia National Laboratories, Mar. 15, 1994, submitted for publication to *Applied Optics*).

The principle underlying these applications involves the fact that a shift occurs in the absorption edge of the light absorption spectrum of certain crystalline materials when they are subjected to compressive or tensile strain. By measuring the degree to which light is capable of passing through a suitable material and comparing it to standards for that material measured under a variety of known physical conditions, one may monitor with great sensitivity the magnitude of compressive or tensile strain to which the material is subjected under test conditions.

FIG. 1 is a graph illustrating the rapid change in optical absorption at the band edge for gallium arsenide semiconductor material. Gallium arsenide is but one of many materials which exhibit this behavior. The graph shows a comparison of band-edge wavelengths and absorption coefficients for gallium arsenide under unstrained, compressed and extended conditions. In an unstrained state, the band edge occurs in the vicinity of 900 nm. For light of a fixed optical wavelength passing through the material, an increase in transmission under compression, and a decrease in transmission under tension is observed. This strain-induced change in optical transmission can be substantial when the band edge is steep. Thus, gallium arsenide can be used as an optical strain gauge.

FIG. 2 illustrates an experimental arrangement whereby gallium arsenide may be used as a strain gauge. The figure shows a chip of gallium arsenide semiconductor material 5 affixed to the surface of a substrate 10 which is to be subjected to strain. The substrate could be a cantilevered beam, for example, whose relevant strain is in the direction shown by the arrow 15. An input optical fiber 20 carries light from an optical source 25 to the surface of the semiconductor material 5 where it enters the semiconductor material and passes through. The amount of light which passes through the semiconductor material depends on the optical absorption at the band edge for that material. Light then exits the gallium arsenide crystal and is collected by an output optical fiber 30 which carries the light to a light intensity detector. Strain in the substrate is transmitted by physical forces to the gallium arsenide chip which behaves optically according to the principles illustrated in FIG. 1. When the strain imposed on the chip causes compression of the chip, this is manifested as an increase in transmission of light through the chip; when the strain causes extension of the chip, a decrease in the intensity of light transmitted through the chip is observed.

FIG. 3 shows an example of experimental results obtained using the optical strain gauge configuration of FIG. 2. For the data shown, the median optical wavelength of the light passing through the sample was about 894 nm and its spectral width was about 4 nm. A significant fractional change in optical transmission is observed for very modest strain levels generated by mechanical loading.

BRIEF SUMMARY OF THE INVENTION

The present invention also uses the shift in absorption edge of crystalline material to measure strain, however, strain in this case results from electrical stimulation of a substrate material rather than from application of external physical force. The present invention is a useful alternative to existing voltmeters technology in that it provides a simple and accurate means for measuring voltage applied either by direct contact with the crystalline material or by subjecting the material to an electric field. In addition, because the invention utilizes fiber optic principles rather than conventional electrical circuitry, it is immune to electromagnetic interference and affords a margin of safety in explosive environments.

Accordingly, it is an object of the present invention to provide a simple, yet accurate, apparatus for measuring electric field strength which employs strain-optic principles where strain is caused by the effect of electrical stimulation on an electrostrictive or piezoelectric substrate.

It is another object of the invention to provide a voltage monitor which comprises: a substrate capable of undergoing electric field-induced deformation; a crystalline material having a conduction band with an edge, in operative association with the substrate, in which strain is generated as a consequence of the electric field-induced deformation of the substrate, and in which the strain causes a change in optical absorption at the edge of the conduction band of the crystalline material; and a means for optically detecting the change in optical absorption at the edge of the conduction band of the crystalline material.

It is another object of the invention to provide a voltage monitor which comprises: a crystalline material having a conduction band with an edge capable of undergoing electric field-induced deformation and, as a consequence of the electric field-induced deformation, exhibiting strain which causes a change in optical absorption at the edge of the conduction band of the crystalline material; and a means for optically detecting the change in optical absorption at the edge of the conduction band of the crystalline material.

It is yet another object of the invention to provide a voltage monitor which incorporates the use of gallium arsenide as an optical strain gauge.

It is yet another object of the invention to provide a voltage monitor which incorporates the use of a non-ferroelectric crystalline material such as gallium arsenide or quartz as a piezoelectric element which may be placed under the influence of an electric field and through which a change in optical absorption at the edge of the conduction band may be observed as an indication of electric field strength.

It is yet another object of the present invention to provide a voltage monitor which employs the use of fiber-optic technology which does not produce, and which is not susceptible to electromagnetic interference, and which does not produce sparks which can be hazardous in a potentially explosive environment.

Upon further study of the specification and appended claims, further objects and advantages of this invention will become apparent to those skilled in the art.

These objects have been obtained by providing an apparatus including an electrostrictive or piezoelectric material which can be subjected to electrical stimulation (by either direct contact with an electrical power source or influence of an electric field), and a means for measuring transmissibility of light through the material, which correlates to the voltage responsible for inducing a given measured piezoelectric or electrostrictive structural change in the material.

DETAILED DISCUSSION

Figure 1:
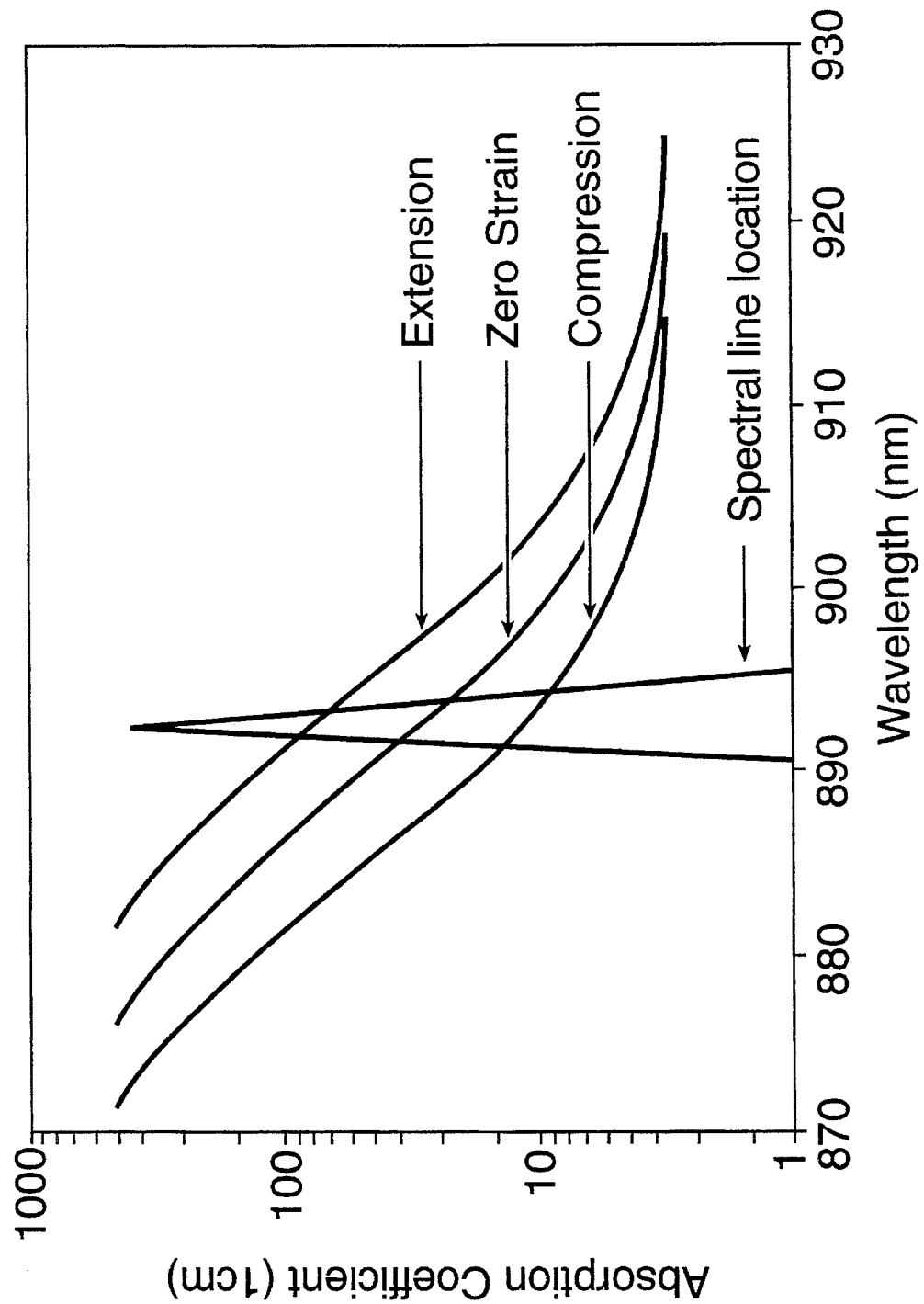
FIG. 1 is a graph depicting a comparison of optical absorption coefficients versus wavelength for compressed, extended and unstrained gallium arsenide material at its band edge.

The optical voltage monitor of the present invention is based on the principle that an electric field can generate strain in a piezoelectric or electrostrictive material. That strain, which is an electric field-induced deformation of crystalline structure, may be measured either directly, by analysis of light absorption at the band edge of the electrically strained substrate, or indirectly, by similarly analyzing light passing through another crystalline material, chosen for its favorable strain optic characteristics, which is affixed to the substrate. This kind of monitor need not be hardwired to the voltage source because it depends directly on the electric field and not current for its operation. Where the electrically less-intrusive configuration is chosen, however, only a fraction of the voltage in question will appear across the sensor.

The electrostrictive effect, which is present to some extent in any dielectric, is the strain that is proportional to the square of the applied field. While electrostrictive materials have the advantage of low hysteresis, their quadratic response does not allow one to determine the direction of the field. However, both the polarity and the magnitude of voltage variations around a bias point can be measured, and more effectively at relatively high bias voltages where the sensitivity of strain to voltage is greatest. A piezoelectric material, on the other hand, undergoes a strain that is linear in the field, and the non-ferroelectric variety exhibits no hysteresis.

Gallium arsenide is well suited to serve as the optical element in a strain-optic voltage monitor because it exhibits an easily detectable change in optical absorption in response to strain. The gallium arsenide could be bonded to either a piezoelectric or electrostrictive substrate, or alternatively, its own weak piezoelectric properties may be used. Where the gallium arsenide is bonded to the substrate, at least theoretically, there could be an additive effect between a piezoelectric response of the gallium arsenide and that of piezoelectric substrate (or a canceling effect in the case of an electrostrictive substrate). In practice, though, these effects are trivial for purposes of most monitoring applications. The piezoelectric effect exhibited by the gallium arsenide is much smaller than the piezoelectric or electrostrictive strength of suitable substrates, which are chosen for their strong piezoelectric or electrostrictive properties. Also, the gallium arsenide strain gauge can conveniently be isolated electrically from the field being measured within the substrate either by controlling the field to ensure that it is constrained within the substrate or, if necessary, by shielding the gauge within a Faraday cage.

If a large enough field is to be measured, using the gallium arsenide as its own piezoelectric would be the most elegant of this type of voltage monitor because it would be the most compact, involve no problems with bonding, and have the highest frequency response. In addition, it would exhibit no hysteresis because gallium arsenide is not ferroelectric. However, consideration would need to be given to what is called the Franz-Keldysh effect, a shift in the absorption edge with the square of the applied electric field. This unitary configuration for the strain-optic voltage monitor is not limited to gallium arsenide: quartz or some other non-ferroelectric, single crystal material would function equally as well. Again, though, high voltages would be needed for such materials to demonstrate an reliably measurable strain-optic response.

Figure 4:
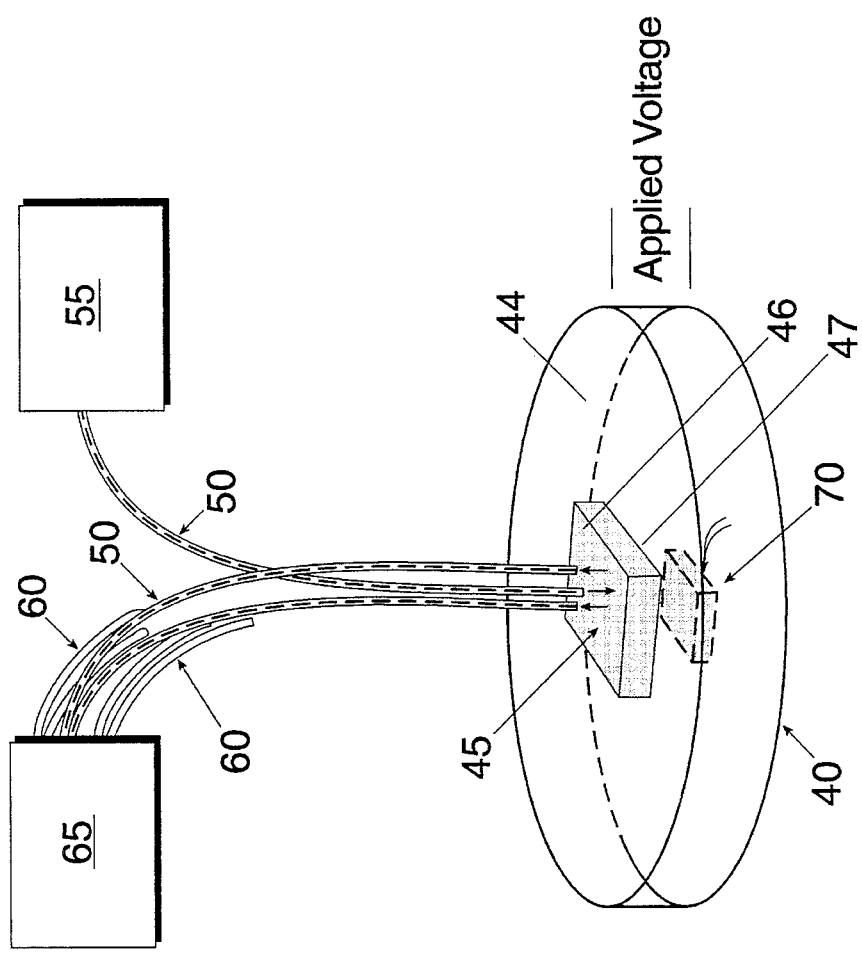
FIG. 4 is a schematic representation showing an experimental arrangement used to calibrate the strain optic voltage monitor of the present invention.

The principles discussed above have been demonstrated using a gallium arsenide strain-optic element and piezoelectric and electrostrictive ceramic substrates. One embodiment of the voltage monitor of the present invention is illustrated in FIG. 4. The terms "above," "below," "top," "bottom," "upward," and "downward" contained in the following description are used merely for convenience and are not intended to be limiting in any way of the scope of the invention claimed.

Referring to FIG. 4, a piezoelectric or electrostrictive material is used as the substrate 40 to be subjected to an electric field either through being hardwired to a voltage source or by being placed within the influence of an external electric field. Affixed to the surface 44 of the substrate 40 is a crystalline optical strain gauge 45 which includes a first surface 47 which adjoins the surface 44 of the substrate 40 and a second surface 46. As mentioned, a gallium arsenide chip is well suited to perform as the crystalline optical strain gauge 45, however, other crystalline materials in which strain causes a change in optical absorption characteristics at the band edge will also suffice.

Positioned above the crystalline optical strain gauge 45, a certain distance above the second surface 46, are optical fibers leading to and from the strain gauge. Among those optical fibers are included at least one input optical fiber 50 and at least one output optical fiber. In the preferred embodiment demonstrated by the inventor, there is a single input fiber 50 surrounded by a bundle of six output fibers 60. (However, a variety of fiber configurations are contemplated and the optimal arrangement will depend on the particular application.) The input fiber conveys light from an optical source 55, emitting primarily at the band edge, and directs that light toward the second surface 46 of the strain gauge 45. The second surface 46 may be coated with an antireflection layer. The light then passes into the crystalline optical strain gauge 45 where it is at least partially transmitted downward to the first surface 44 and reflected. This reflected light is then transmitted, again at least partially, upward through the crystalline material where it ultimately exits the crystalline optical strain gauge and is received by the output fibers 60. The light thus received is then carried to an optical detector 65, well known in the art, which is capable of detecting the intensity of the light carried to it.

The optimal distance for positioning the ends of the optical fibers (50 and 60) above the second surface 46 depends on the separation between the receiving output fibers 60 and their position in relation to the transmitting input fiber 50. If there were no lateral separation between the transmitting and receiving fibers (i.e., if they were one and the same) the optimal distance would be zero. In the embodiment shown in FIG. 4, however, it is necessary for the light exiting the crystalline optical strain gauge to diverge somewhat in order for it to be received by the output fibers 60. The optimal distance determined by the inventor using the bundle of six output fibers surrounding a single input fiber was about 0.5 mm between the ends of the fibers and the top surface of the optical strain gauge.

FIG. 4 also shows an electrical strain gauge 70 affixed to the substrate. This electrical strain gauge does not play a role in the function of the invention disclosed here. It is merely shown as a means to provide experimental corroboration of results obtained using the invention.

The non-contact method of coupling the light to the sample has the advantage of automatically aligning the transmitting and receiving fibers and of generally simplifying the assembly of the sensor. It also allows the crystalline material such as gallium arsenide to be thinner than a fiber diameter, which may improve strain transmission and frequency response.

Figure 2:
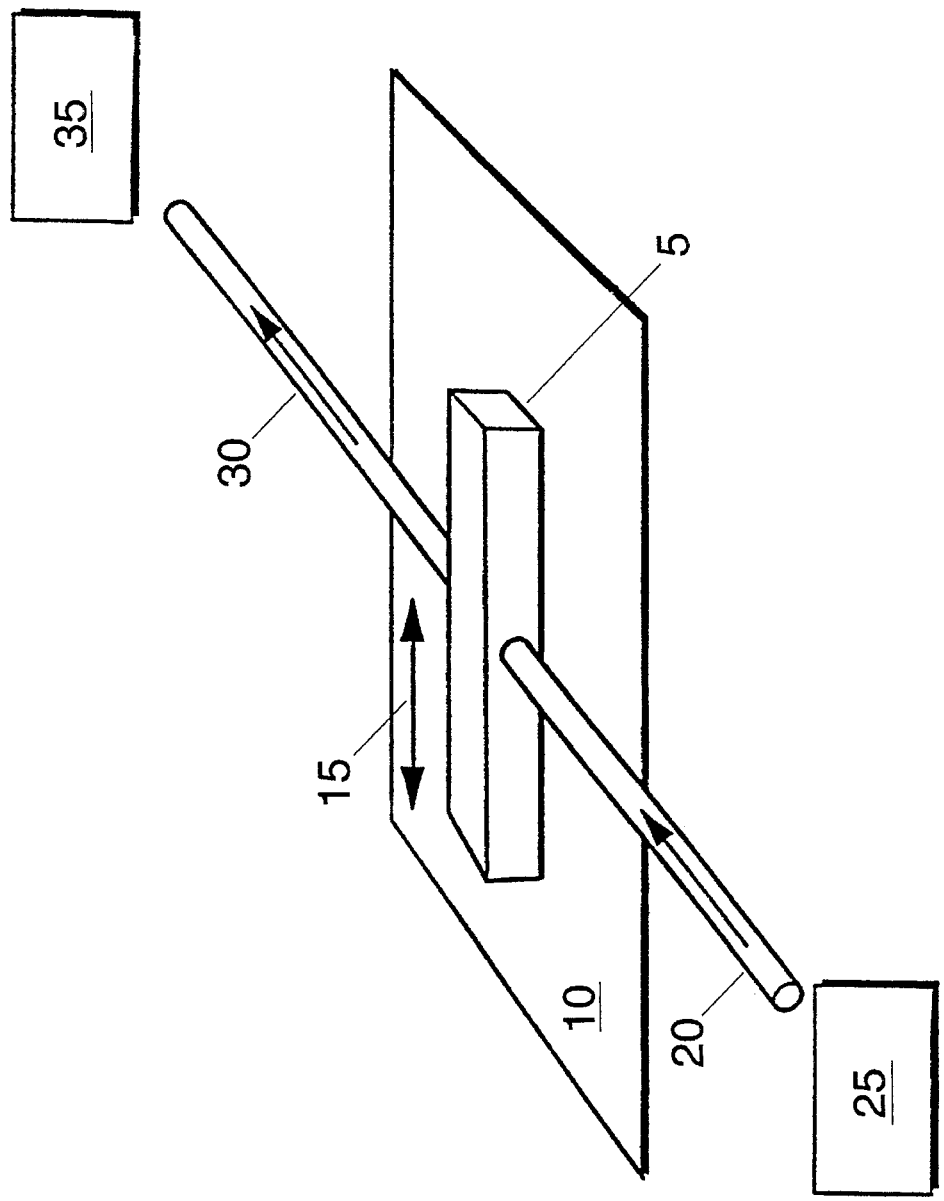
FIG. 2 is a schematic representation showing an experimental arrangement for an optical strain gauge.
Figure 3:
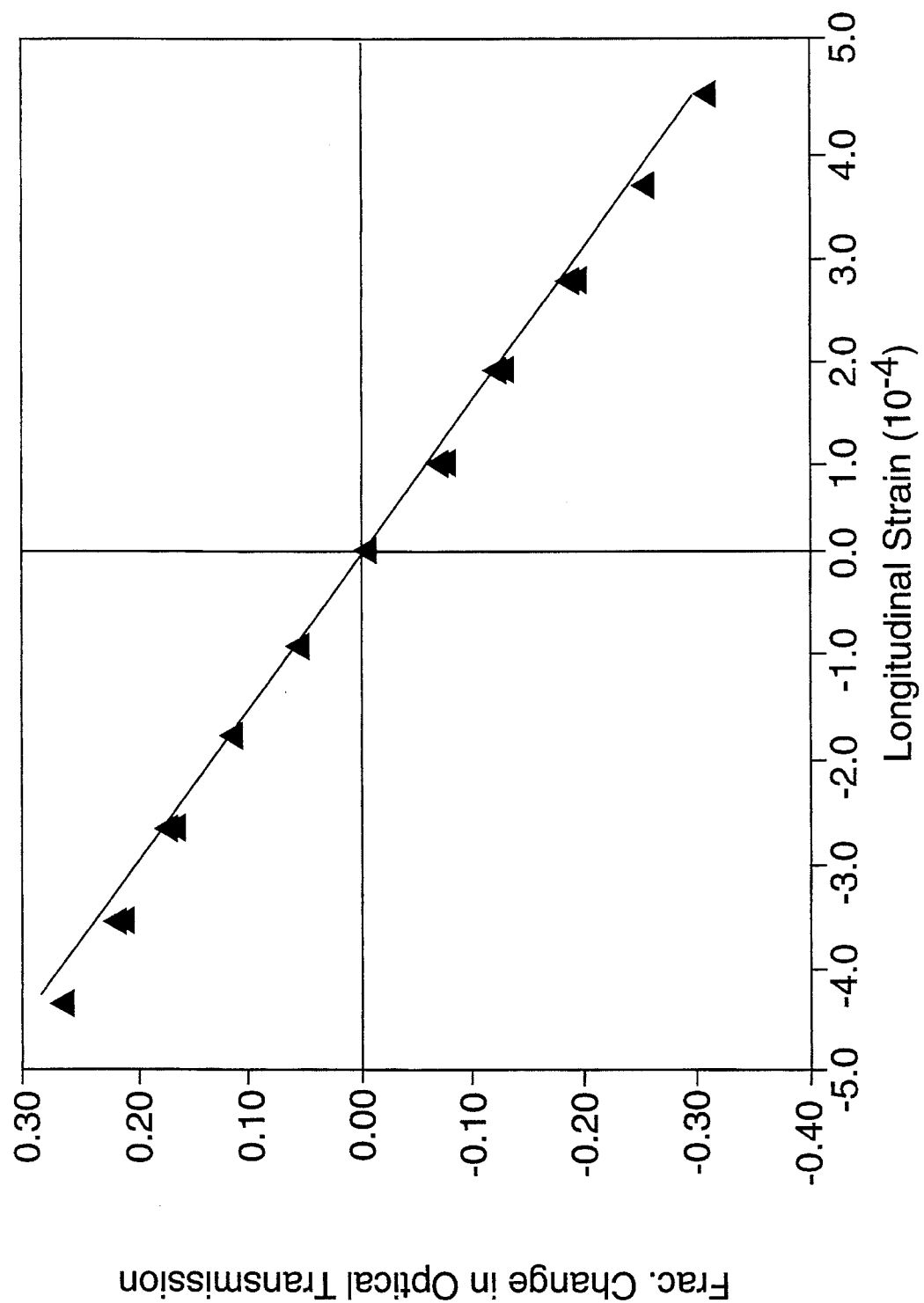
FIG. 3 is a graph illustrating the fractional change in optical transmission through a gallium arsenide sample versus strain in its long dimension using the arrangement shown in FIG. 2.

Although the arrangement of fibers shown in FIG. 4 is both simple and convenient, another embodiment of the invention uses a fiber arrangement similar to that shown in FIG. 2 for the optical strain gauge. The placement of input fibers and output fibers on opposite sides of the crystalline material functioning as a strain gauge would be adequate for purposes of the voltage monitor if the present invention, as well. Also, by bonding the fibers in this configuration, spurious signals produced by relative motion between the crystalline material and the fibers does not occur. Such motion, however, would not normally result from electrically-induced strain. In this arrangement, reflection does not play a direct role in defining the path of light through the material. Since in this embodiment the light only passes through the crystal in one direction, rather than two directions as in the arrangement of FIG. 4, the effect of light absorption would be less in comparison to the embodiment described above. Otherwise, the positioning of the optical strain gauge with respect to the piezoelectric or electrostrictive substrate material would be similar to that shown in FIG. 4.

The electrostrictive material used in demonstration of the embodiment depicted in FIG. 4 was PBZT (lead, barium, zirconate, titanate) prepared in a square disk, 37 mm on a side and 0.76 mm thick. It was developed by Sandia National Laboratories many years ago for internal use, but more commonly used electrostrictives such as PMN (lead, magnesium, niobate) would be equally suitable. The piezoelectric ceramic used to demonstrate the embodiment was PZT (lead, zirconate, titanate) obtained from *Channel Industries*. This was a circular disk, 25 mm in diameter and 0.71 mm thick. Bonded to the bottom side of each of the substrates was a foil electric strain gauge from *MicroMeasurements* that allowed monitoring strain directly as a function of applied voltage. The gallium arsenide strain gauge was square disk 3 mm on a side and 0.2 mm thick.

Figure 5:
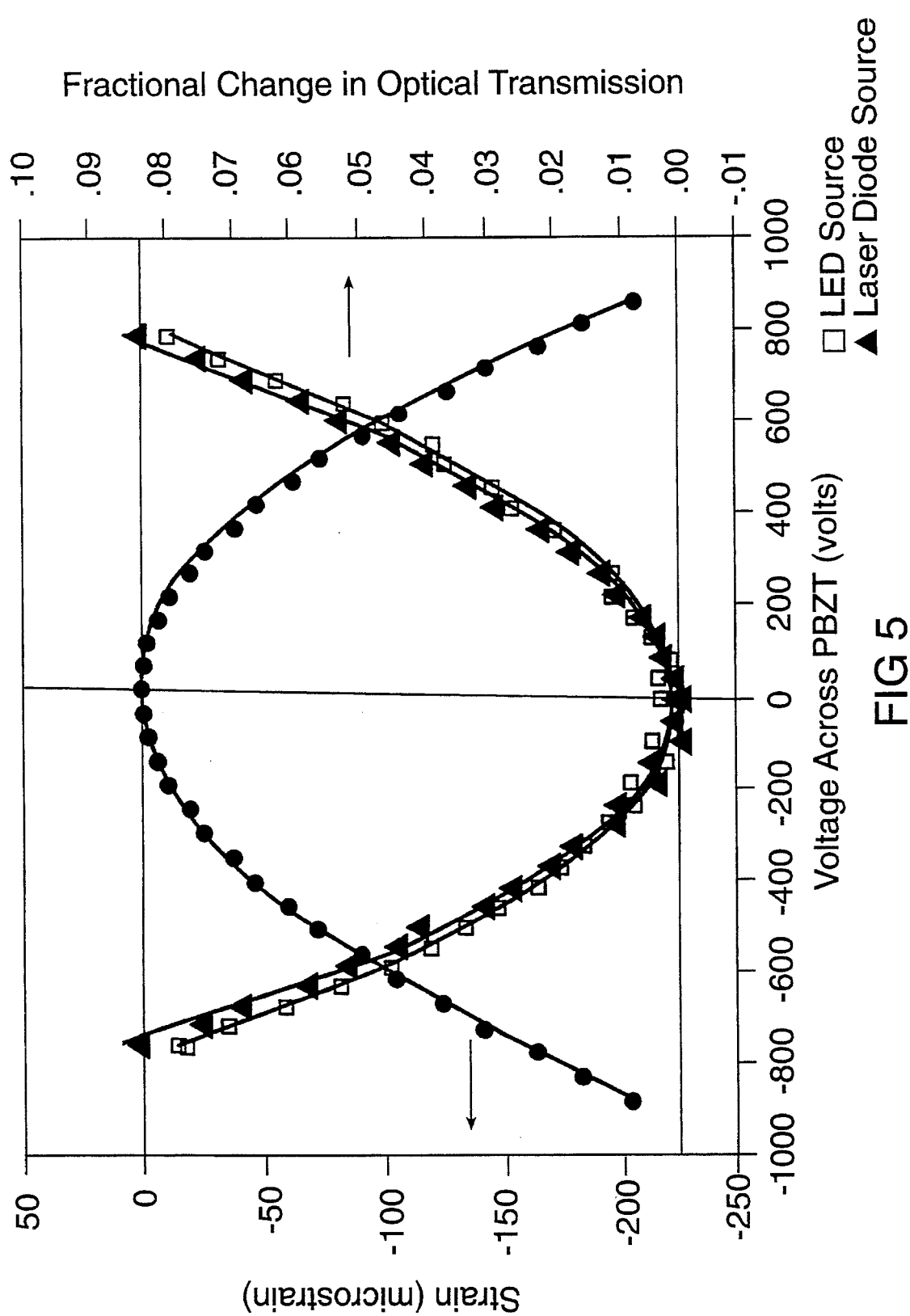
FIG. 5 is a graph comparing strain and fractional change in optical transmission versus voltage across PBZT (lead, barium, zirconate, titanate) electrostrictive material.

FIG. 5 summarizes results obtained from experiments using the electrostrictive material. Characteristic of it are the quadratic dependence of strain on voltage and the lack of hysteresis. The negative sign of the strain indicates lateral contraction. As a consequence of the negative linear response of the gallium arsenide, the optical curves essentially reproduce the strain curve with a sign reversal. In one of these, a laser diode light source operated as a light emitting diode (LED) by running at a current below its room-temperature lasing threshold. In this mode, the peak of its emission occurred at a wavelength of about 898 nm and its spectral width was about 20 nm. Thus its spectral output covered the entire band edge of gallium arsenide and produced a kind of average sensitivity. In a second test, the diode was lasing at room temperature. In this mode, the peak wavelength was about the same, but the spectral width was only about 4 nm. Therefore, it produced a sensitivity associated with a particular portion of the band edge. For this particular operating temperature of the laser diode in its lasing mode, the data in FIG. 5 show that the sensitivity of the voltage monitor is slightly greater than when the optical source is run as an LED.

Figure 6:
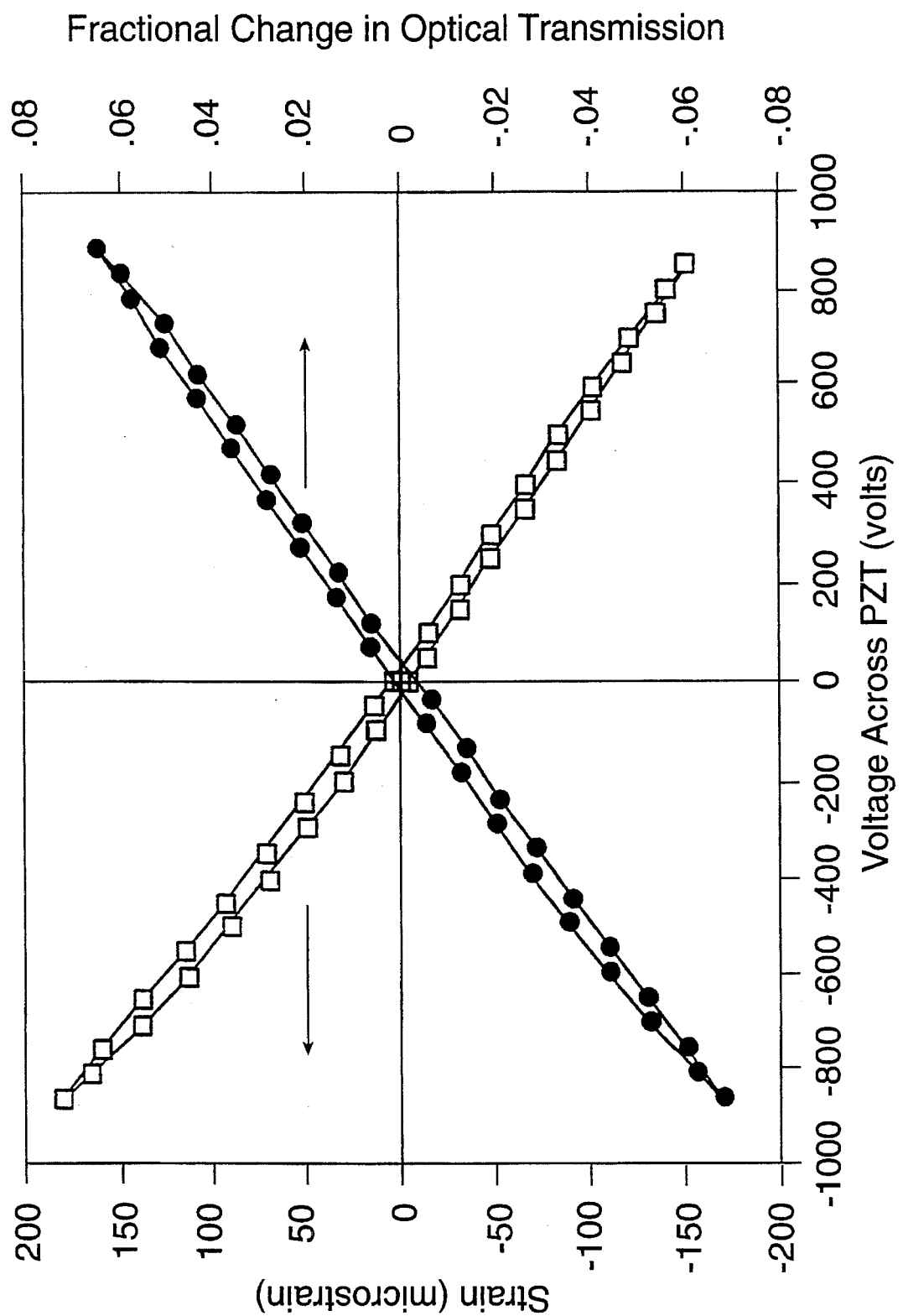
FIG. 6 is a graph comparing strain and fractional change in optical transmission versus voltage across PZT (lead, zirconate, titanate) piezoelectric material.

Analogous to FIG. 5, FIG. 6 summarizes the results of experiments with the piezoelectric ceramic, with the laser operating as an LED. In keeping with the basic behavior of this material and the gallium arsenide, both curves are linear, of opposite sign, and exhibit a level of hysteresis that may be of little concern in many applications.

From the foregoing description, one skilled in the art can ascertain the essential characteristics of the invention described in-this specification and the appended claims, and without departing from the spirit and scope thereof, can make various changes and modifications of the invention to adapt to various usages and conditions.

What is claimed is:

1. A voltage monitor comprising:
   a substrate capable of undergoing electric field-induced deformation,
   a crystalline material, having a conduction band with an edge in operative association with said substrate, in which strain is generated as a consequence of said electric field-induced deformation of said substrate, and in which said strain causes a change in optical absorption at the edge of said conduction band of said crystalline material, and
   a means for optically detecting said change in optical absorption at the edge of said conduction band of said crystalline material.

2. A voltage monitor comprising:
   a crystalline material, having a conduction band with an edge, capable of undergoing electric field-induced deformation and, as a consequence of said electric field-induced deformation, exhibiting strain which causes a change in optical absorption at the edge of the conduction band of said crystalline material, and
   a means for optically detecting said change in optical absorption at the edge of the conduction band of said crystalline material.

3. The voltage monitor of claim 1 wherein said substrate is affixed to said crystalline material.

4. The voltage monitor of claim 3 wherein said substrate is an electrostrictive material.

5. The voltage monitor of claim 3 wherein said substrate is a piezoelectric material.

6. The voltage monitor of claim 2 wherein said crystalline material is a piezoelectric material.

7. The voltage monitor of claim 6 wherein said piezoelectric material is a non-ferroelectric, single crystal material.

8. The voltage monitor of claim 7 wherein said piezoelectric material is quartz.

9. The voltage monitor of claim 7 wherein said piezoelectric material is gallium arsenide.

10. The voltage monitor of claim 4 wherein said electrostrictive material comprises lead, barium, zirconate and titanate.

11. The voltage monitor of claim 5 wherein said piezoelectric material comprises lead, zirconate and titanate.

12. The voltage monitor of claim 3 wherein said crystalline material is gallium arsenide.

13. The voltage monitor of claim 1 wherein said means for optically detecting said change in optical absorption at the edge of the conduction band of said crystalline material comprises:
   a light source,
   a light intensity detector,
   at least one optical fiber capable of carrying light from said light source to a location on a surface of said crystalline material from which location said light passes into and through said crystalline material,
   a fiber-optic collection and carrying means capable of receiving light which passes through said crystalline material and carrying said light to said light intensity detector.

14. The voltage monitor of claim 2 wherein said means for optically detecting said change in optical absorption at the edge of the conduction band of said crystalline material comprises:
   a light source,
   a light intensity detector,
   at least one optical fiber capable of carrying light from said light source to a location on a surface of said crystalline material from which location said light passes into and through said crystalline material,
   a fiber-optic collection and carrying means capable of receiving light which passes through said crystalline material and carrying said light to said light intensity detector.

15. The voltage monitor of claim 13 further comprising a reflection means capable of reflecting said light passing through said crystalline material, and wherein said fiber-optic collection and carrying means is capable of receiving light reflected by said reflection means.

16. The voltage monitor of claim 14 further comprising a reflection means capable of reflecting said light passing through said crystalline material, and wherein said fiber-optic collection and carrying means is capable of receiving light reflected by said reflection means.

17. The voltage monitor of claim 15 wherein said reflection means is a surface of said crystalline material other than said surface from which location said light passes into and through said crystalline material.

18. The voltage monitor of claim 16 wherein said reflection means is a surface of said crystalline material other than said surface from which location said light passes into and through said crystalline material.

19. The voltage monitor of claim 15 wherein said fiber-optic collection and carrying means comprises a bundle containing a plurality of optical fibers.

20. The voltage monitor of claim 16 wherein said fiber-optic collection and carrying means comprises a bundle containing a plurality of optical fibers.

21. The voltage monitor of claim 3 wherein said crystalline material is a semiconductor.

22. The voltage monitor of claim 2 wherein said crystalline material is a semiconductor.

* * * * *